(12) United States Patent
Foong

(10) Patent No.: US 7,179,682 B2
(45) Date of Patent: Feb. 20, 2007

(54) PACKAGED DEVICE AND METHOD OF FORMING SAME

(75) Inventor: Chee Seng Foong, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 34 days.

(21) Appl. No.: 11/191,132

(22) Filed: Jul. 27, 2005

(65) Prior Publication Data

US 2006/0087038 A1    Apr. 27, 2006

(30) Foreign Application Priority Data

Oct. 23, 2004   (MY) ............................... PI20044381

(51) Int. Cl.
*H01L 21/00* (2006.01)

(52) U.S. Cl. ....................... 438/106; 438/113; 438/127

(58) Field of Classification Search ................ 438/106, 438/113, 127, 114, 122
See application file for complete search history.

(56) References Cited

U.S. PATENT DOCUMENTS

| | | | |
|---|---|---|---|
| 5,695,109 A * | 12/1997 | Chiang et al. | 228/33 |
| 6,148,900 A * | 11/2000 | Yamasaki et al. | 164/80 |
| 6,215,179 B1 * | 4/2001 | Ohgiyama | 257/676 |
| 6,551,862 B2 * | 4/2003 | Oota et al. | 438/118 |
| 6,992,380 B2 * | 1/2006 | Masumoto | 257/709 |
| 7,056,766 B2 * | 6/2006 | Shiu et al. | 438/106 |
| 2006/0234421 A1 * | 10/2006 | Lo et al. | 438/106 |

* cited by examiner

*Primary Examiner*—Michael Lebentritt
*Assistant Examiner*—Angel Roman
(74) *Attorney, Agent, or Firm*—Charles Bergere

(57) ABSTRACT

A method of packaging an integrated circuit die includes the steps of loading an array of soft conductive balls into recesses formed in a platen and locating the platen in a first part of a mold cavity. A second part of the mold is pressed against the balls to flatten a surface of the balls. A first mold compound then is injected into the mold cavity such that the mold compound surrounds exposed portions of the balls. The balls are removed from the platen and a first side of an integrated circuit die is attached to the balls. Die bonding pads on a second side of the die are electrically connected to respective ones of the balls surrounding the die, and then the die, the electrical connections, and a top portion of the conductive balls is encapsulated with a second mold compound.

19 Claims, 4 Drawing Sheets

PACKAGED DEVICE AND METHOD OF FORMING SAME

BACKGROUND OF THE INVENTION

The present invention relates to integrated circuit packaging, and more particularly to an improved process for fabricating a Ball Grid Array (BGA) packaged device.

An integrated circuit (IC) die is a small device formed on a semiconductor wafer, such as a silicon wafer. A leadframe is a metal frame that usually includes a paddle that supports the IC die that has been cut from the wafer. The leadframe also has lead fingers that provide external electrical connections. That is, the die is attached to the die paddle and then bonding pads of the die are connected to the lead fingers via wire bonding or flip chip bumping to provide the external electrical connections. Encapsulating the die and wire bonds or flip chip bumps with a protective material forms a package. Depending on the package type, the external electrical connections may be used as-is, such as in a Thin Small Outline Package (TSOP), or further processed, such as by attaching spherical solder balls for a BGA. These terminal points allow the die to be electrically connected with other circuits, such as on a printed circuit board. However, it can be expensive and time-consuming to form a leadframe and package a device if steps like chemical etching and etch back are required.

Thus, it would be desirable to eliminate such etching steps, and further, to eliminate the need for the leadframe. It is desirable to have a method of decreasing the size of packaged ICs too.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. Further, it will be understood by those of skill in the art that the drawings have been simplified and are not drawn to scale.

The present invention provides a method of packaging an integrated circuit die, including the steps of:

loading a plurality of conductive balls into recesses formed in a platen;

transferring the platen to a cavity of a first part of a mold;

pressing a second part of the mold against the conductive balls, thereby at least partially flattening a top surface of the conductive balls;

injecting a first mold compound into the mold, wherein the first mold compound surrounds exposed portions of the conductive balls;

removing the conductive balls from the platen, wherein the conductive balls are held together by the first mold compound;

attaching a first side of an integrated circuit die to a plurality of the conductive balls, wherein the die is surrounded by others of the conductive balls;

electrically connecting die bonding pads on a second side of the die to respective ones of the conductive balls surrounding the die; and encapsulating at least the second side of the die, the electrical connections, and at least part of the conductive balls with a second mold compound.

In another embodiment, a heat sink may be located coplanar with the conductive balls and the die attached to a surface of the heat sink.

The present invention further provides a packaged integrated circuit die having a plurality of conductive balls having a top, flattened surface and a first mold compound that holds the plurality of conductive balls together. The top, flattened surfaces of the balls are generally coplanar with a top surface of the first mold compound, and bottom, opposing surfaces of the balls are exposed. An integrated circuit die having a first side is attached to a plurality of the conductive balls. The die is surrounded by others of the conductive balls. The die is electrically coupled to the others of the conductive balls. A second mold compound encapsulates at least a second side of the die opposing the die first side, and the top surfaces of the conductive balls.

Figure 1:
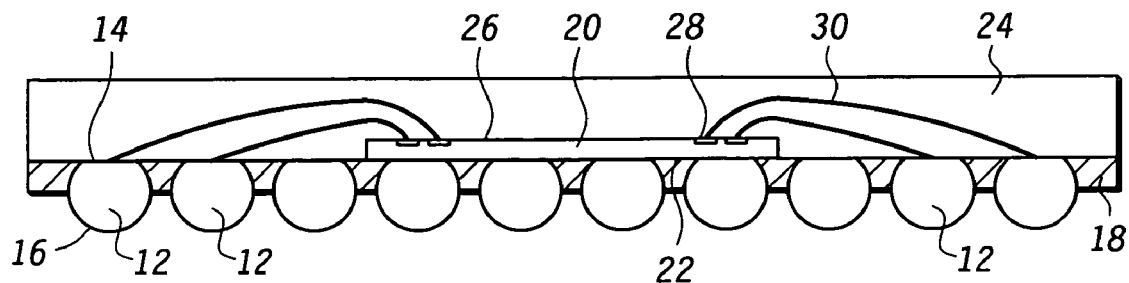
FIG. 1 is an enlarged cross-sectional view of a packaged integrated circuit in accordance with a first embodiment of the present invention.

Referring now to FIG. 1, an enlarged cross-sectional view of a packaged semiconductor device 10 formed in accordance with an embodiment of the present invention is shown. The packaged device 10 includes a plurality of conductive balls 12 having a top, flattened surface 14 and bottom, opposing surface 16. A first mold compound 18 holds the plurality of conductive balls 12 together. The top, flattened surfaces 14 of the balls 12 are generally coplanar with a top surface of the first mold compound 18, and the bottom, opposing surfaces 16 of the balls 12 are exposed. An integrated circuit die 20 has a first side thereof 22 attached to a plurality of the conductive balls 12. The die 20 is surrounded by others of the conductive balls 12 and the die 20 is electrically coupled to the others of the conductive balls 12. A second mold compound 24 encapsulates at least a second side 26 of the die 20 opposing the die first side 22, and the top surfaces 14 of the conductive balls 12. The second mold compound 24 is of a type known to those of skill in the art that is commonly used for packaging integrated circuits.

The conductive balls 12 preferably are C5 (Controlled Collapse Chip Carrier Connection) solder balls. The balls 12 are made with an electrically conductive material so that electrical signals can be passed therethrough. The conductive material may be a metal, such as copper or gold, or an alloy thereof, or a soft solder, such as 63/37 material (63% tin, 37% lead) or 90/10 (90% lead, 10% tin). Alternatively, the soft balls 14 may be formed of a polymer base material with metallic surface finish. A lead free package can be achieved by using lead free metallic balls.

The bottom surfaces 16 of the balls 12 are exposed and allow the integrated circuit die 12 to be connected to a printed circuit board. The balls 12 are used to pass data, power and ground signals to/from the die 20 and a substrate or printed circuit board (not shown), as is known by those of skill in the art, while others of the balls 12 to which the die 20 is attached can conduct heat from the die 20 (i.e., thermal management) and enhance board level solder joint strength. That is, the balls 12 under the die 20 provide a solderable surface that enhances board level solder strength. It is noted that balls at the corners and even along the package edges also can provide connections that enhance the mechanical strength of the package.

The top surfaces 16 of the balls 12 are flattened and coplanar. The top surfaces 16 may be flattened by pressing, as discussed in more detail below. The balls 12 are held together with the first mold compound 18. The first mold compound 18 is of a type known to those of skill in the art that is commonly used for packaging integrated circuits.

The integrated circuit die 20 may be any type of known die, such as one cut from a silicon wafer, and may be any type of circuit, such as a digital signal processor, a special purpose circuit, etc. Such circuits are well known to those of skill in the art. The bottom surface 22 of the die 20 is attached to the top flattened surfaces 14 of one or more of the conductive balls 12 with a die attach material (not shown). The die attach material may be an adhesive of a type well known in the semiconductor art for attaching dies to substrates, such as an epoxy.

The top surface 26 of the integrated circuit die 20 includes a plurality of die bonding pads 28. The die bonding pads 28 are electrically connected to ones of the conductive balls 12 that surround the die 20. In one embodiment, the die bonding pads 28 are connected to the conductive balls 12 with wires 30 via wirebonding. Known wirebonding processes, such as thermosonic wire bonding may be used to connect the wires 30 to the die bonding pads 28 and the top surface 14 of the balls 12.

As is known by those of skill in the art, various size wires are available for connecting die to substrates, with the wire size being selected based on, among other things, pad pitch. The bond wire 30 has a diameter of between about 15 μm to about 55 μm, although other diameter bond wires may be used and the invention should not be limited to a particular bond wire diameter. For example, 63 μm pitch applications use 25 μm diameter wire, while 52 μm and 44 μm pitch applications use 20.3 μm diameter wire. Development is being done for a 37 μm pitch application using 17 μm diameter wire. Thus, as is known in the art, fine pitch and ultra-fine pitch wire bonding processes may be performed depending on the pad pitch. In one embodiment of the invention, insulated bond wire is used. Insulated bond wire comprises a conductive core coated with an electrically insulating material and is suitable for fine pitch and ultra-fine pitch wirebonding. The insulating material prevents the wire from shorting to other wires or other conductive structures. In general, gold and aluminum are the most commonly used elements to make the conductive core of the bonding wire. Both gold and aluminum are strong and ductile and have similar resistance in most environments. Gold wire is sometimes doped with a dopant, such as beryllium, calcium in order to stabilize it. Small-diameter aluminum wire is often doped with silicon or sometimes magnesium to improve its breaking load and elongation parameters. In addition to gold and aluminum, copper, palladium-alloy, platinum and silver bonding wire are also known. In an embodiment of the invention, insulated wires having a diameter of less than about 25 μm are used. The insulative coating preferably is an organic insulative coating having a thickness of about 0.5 μm to about 2.0 μm that can be thermally decomposed during free air ball formation. Further, the wires 30 preferably have a melting temperature (Tg) of about 180° to 350° C.

The balls 12 are made of a soft material so that the wires 30 can be readily wirebonded thereto. Preferably, the wires 30 are made of a stiffer or more rigid material, such as copper or a hard gold alloy so that during wirebonding, the wires 30 penetrate into and are embedded within the balls 12. Using a harder material for the wires 30 allows the wires 30 to penetrate into the balls 12, hence forming a connection by embedding the hard wires 30 in the softer balls 12.

Figure 2:
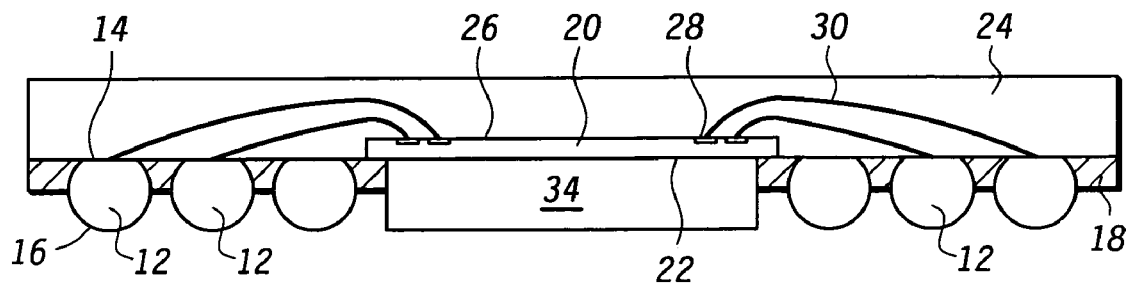
FIG. 2 is an enlarged cross-sectional view of a packaged integrated circuit in accordance with a second embodiment of the present invention.

Referring now to FIG. 2, another embodiment of a packaged device 32 is shown. In this embodiment, instead of attaching the die 20 to the balls 12, the die 20 is attached to a heat sink 34. The heat sink 34 preferably is coplanar with and surrounded by a plurality of the balls 12. More particularly, a first surface of the heat sink 32 to which the die is attached is coplanar with the top surface of the balls 12 and a second, opposing surface of the heat sink 34 is coplanar with the bottom surface 16 of the balls 12. Thus, the second side of the heat sink 34 is exposed. The heat sink 34 preferably has a thickness that is equal to a diameter of the balls 12 as measured from the top, flat surface 14 to the bottom surface 16. The die 20 may be attached to the heat sink 34 with a die attach adhesive or solder (not shown). In order to provide good thermal properties, the heat sink 34 preferably is formed of a solid metal plate, such as copper slug. The heat sink 34 further improves the thermal performance and increases the solderable area of the package 32.

Figure 3:
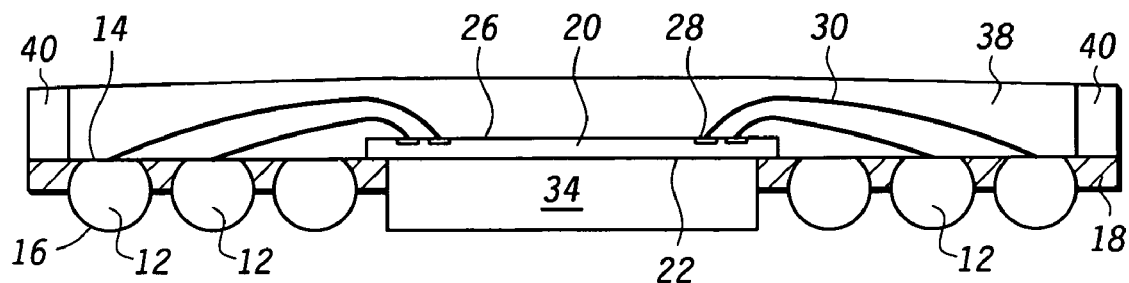
FIG. 3 is an enlarged cross-sectional view of a packaged integrated circuit in accordance with a third embodiment of the present invention.

Referring now to FIG. 3, yet another alternative of a packaged device 36 is shown. The packaged device 36 is similar to the packaged device 32 (FIG. 2) except that a second mold compound 38 has been formed over the die 20, wires 30 and top surfaces 14 of the balls 12 as a glob top. In order to perform the glob top encapsulation process, dams or flanges 40 are formed at the sides of the package to retain the second mold compound 38. The dams 40 may be formed of the first mold compound 18. It will be appreciated that the glob top encapsulation process may be performed on a package with or without the heat sink 34. That is, although the packaged device 36 includes the heat sink 34, the heat sink 34 is not required.

Figure 4A:
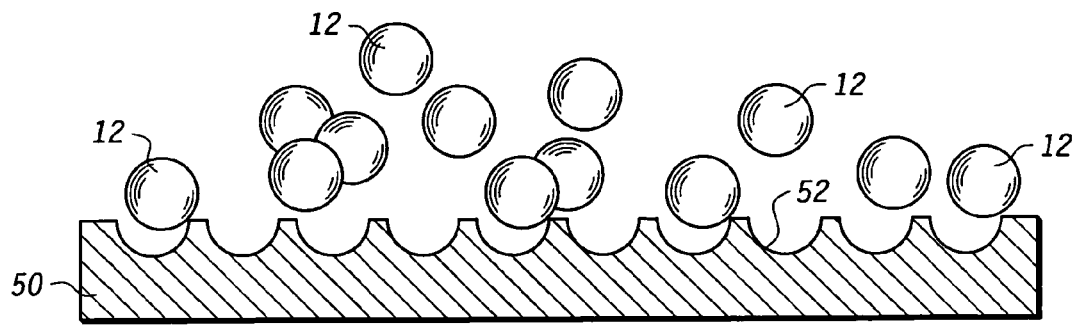
FIGS. 4A–4H are perspective views illustrating the steps for fabricating packaged semiconductor devices in accordance with the present invention.
Figure 4B:
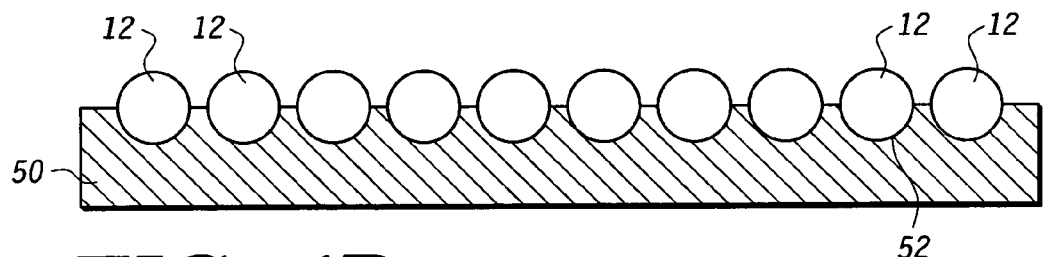
Figure 4C:
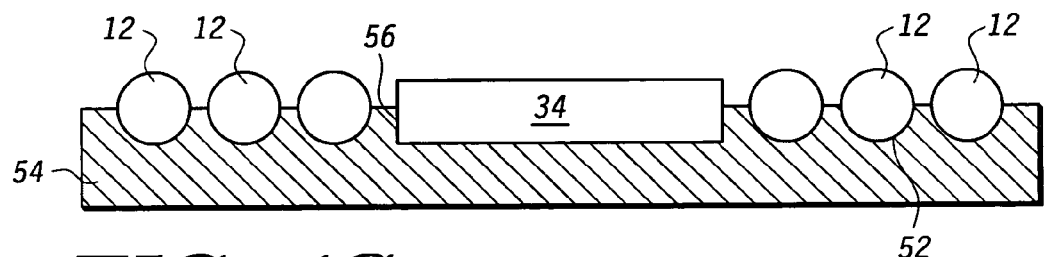

Referring now to FIGS. 4A–4H, a method for packaging an IC die in accordance with an embodiment of the present invention will be described. FIGS. 4A and 4B are enlarged cross-sectional views illustrating a platen or fixture 50 into which a plurality of conductive balls 12 is loaded. The platen 50 is a block of metal having a large flat surface with a plurality of cavities or recesses 52 in which the balls 12 are loaded. The cavities 52 are laid out in a grid or array on the surface of the platen 50. FIG. 4A shows the balls 12 being loaded into the platen 50 and FIG. 4B shows the balls 12 disposed within the cavities 52. The cavities 52 are generally circular, as shown. However, the cavities 52 may have a flat or partially flattened bottom surface so that the bottoms of the balls 12 can be flattened or partially flattened, such as by pressing. The balls 12 may be loaded into the recesses 52 using known technology, such as a shaker. The recesses 52 are spaced at a pitch to match the required ball pitch for a packaged device, such as 1.27 mm apart. Once the balls are loaded in the recesses 52, the entire platen 50 is transferred into a mold cavity. An alternative to using the platen 50 is to load the balls 12 into an array of holes located in the bottom of a mold cavity. The balls 12 could be placed in such holes in a number of ways, such as with a mask. FIG. 4C shows the balls 12 being placed in a platen 54 that has recesses 52 and a space 56 for a heat sink 34. In this embodiment, the heat sink 34 is placed in the space 56 prior to loading the balls 12 into the recesses 52.

Figure 4D:
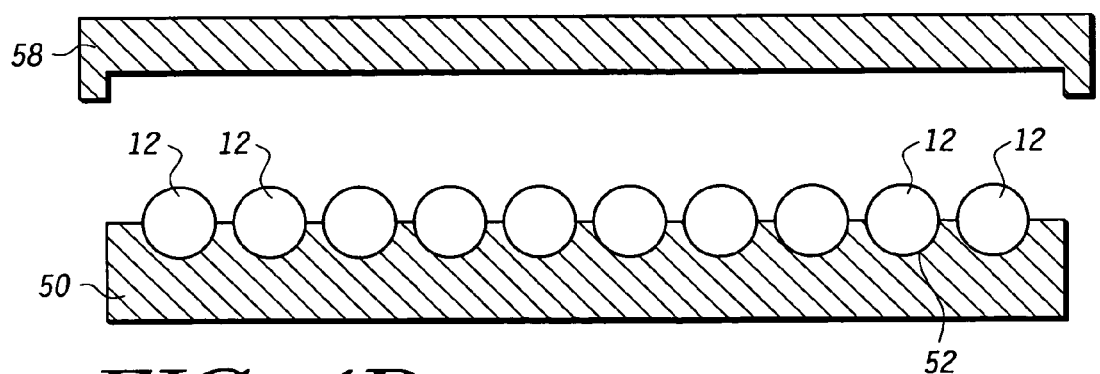
Figure 4E:
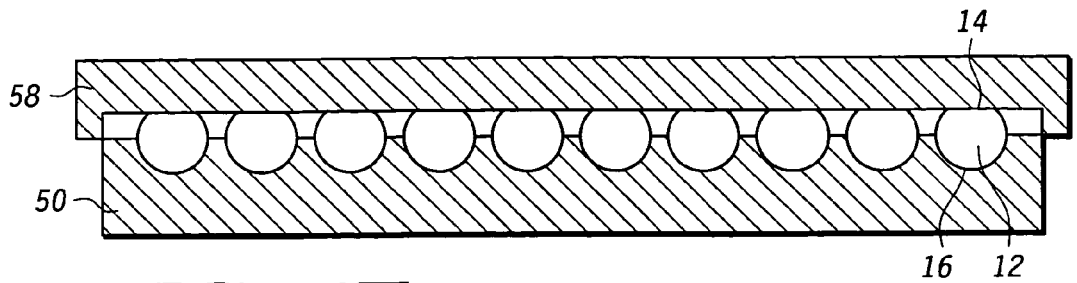

As previously discussed, the balls 14 are formed of a soft, conductive material that can be deformed, such as a soft metal. Example metals are solder or gold. As is known by those of skill in the art, most BGA balls are made out of 63/37 material (63% tin, 37% lead), which is very soft. Even when 90/10 (90% lead, 10% tin) material is used, the ball shape can deform. Referring now to FIGS. 4D and 4E, after the balls 12 are located in the platen 50, the top surfaces 14 of the balls 12 are flattened either with a first top 58 of the mold, or by a press, via a mechanical coining process. That is, the mold top 58 is pressed against the top surfaces 14 of the balls 12 within the cavities 52 of the platen 50, which flattens the top surfaces 14 of the balls 12. If the cavities 52 also have a flat or partially flat bottom surface, then the bottom surfaces 16 of the balls 12 are flattened in the same way as the top surfaces 14. Thus, either one or both of the top and bottom surfaces 14 and 16 of the balls 12 are flattened or partially flattened.

Figure 4F:
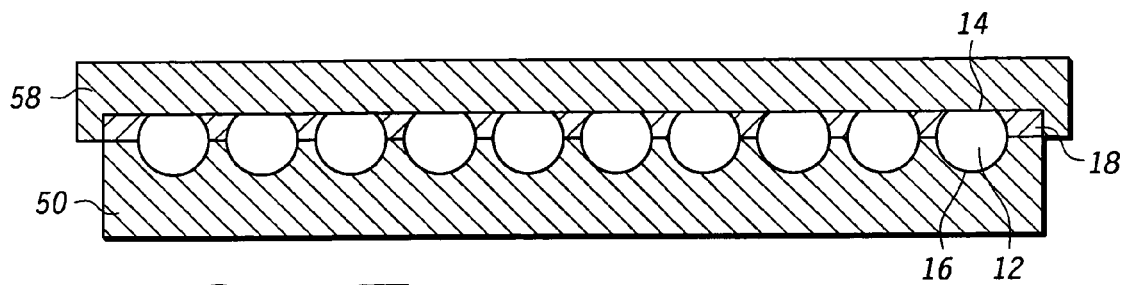

Referring now to FIG. 4F, after the mechanical coining process, a first injection molding process is performed such that the first mold compound 18 surround the balls 12. That is, the first mold compound 18 is injected into the mold and the first mold compound 18 surrounds the exposed portions of the balls 12. Injection molding is well known in the art and further description thereof is not required for a complete understanding of the invention.

Figure 4G:
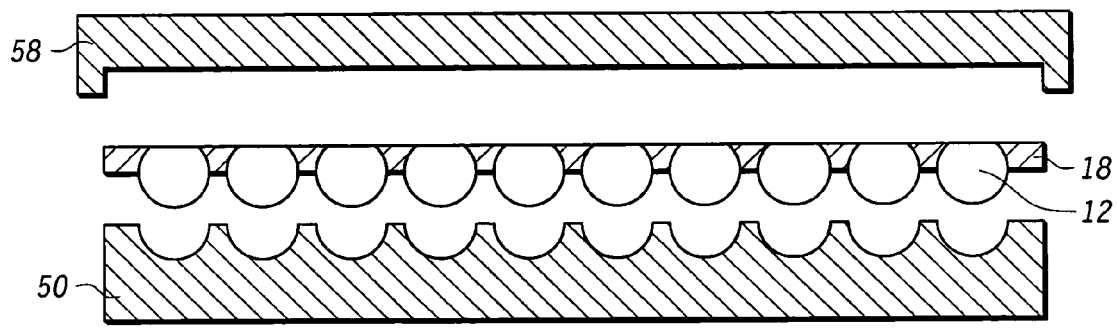

Referring to FIG. 4G, after the first mold compound 18 solidifies, the first top 58 of the mold is removed. At this point, the balls 12 may be removed from the platen 50 or the balls 12 may remain in the platen 50 for further processing, as described below. For illustrative purposes, in FIG. 4G the balls 12 are shown detached or separated from the platen 50. However, in the presently preferred embodiment, the balls 12 are not yet removed from the platen 50.

Figure 4H:
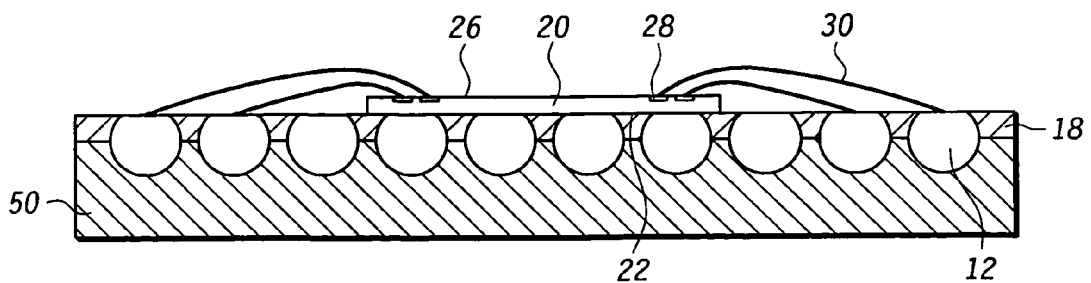

Referring to FIG. 4H, the integrated circuit die 20 is attached to a plurality of the balls 12 at a predetermined location. The die 20 has a bottom surface 22, and a top surface 26 that includes a plurality of wire bonding pads 28. In the presently preferred embodiment, the bottom surface 22 of the die 20 is attached directly to the balls 12 with a die attach adhesive (not shown). The die 20 is attached at locations such that the die 20 is surrounded by a plurality of the balls 12. The number of I/O's is used to determine the number of balls 12 that surround the die 20. Attaching the die 20 on the top surface 14 of a plurality of the balls 12 allows a platen into which the balls 12 are loaded to be uniform in size and have a single ball matrix pattern. A single ball matrix pattern allows different size die and different package sizes to be formed without having to change the size of the platen. Further, as discussed above, the balls 12 upon which the die 20 is attached serve as a thermal path for the die 20 and provide a solderable surface that enhances board level solder joint strength.

As previously discussed, other options for die attach exist. For example, instead of a die attach adhesive, the die could be soldered to the balls 12. Further, as shown in FIGS. 2 and 3, the die 20 can be attached to a heat sink 34 (e.g., a solid metal plate) with an epoxy or solder. The heat sink 34 can further improve the thermal performance of the package and increase the solderable area of the package.

Referring again to FIG. 4H, after the die 20 has been attached to the balls 12, as described above, the wire bonding pads 28 on the die 20 are electrically connected to respective ones of the balls 12 that surround the die 20. More particularly, bonding wires 30 are connected from the die wire bonding pads 28 to respective ones of the balls 12. One end of the wires 30 is connected to the die bonding pads 28 and another end is connected to the balls 12 using a wire bonding process as is known in the art. However, as the balls 12 are held together with the first mold compound 18, in order that the structure of the first mold compound 18 is not compromised, an alternative to the ultrasonic force used in the traditional thermosonic wire bonding process may be used. For example, instead of applying the traditional thermosonic bonding, hard wire made of copper or a hard gold alloy is used to penetrate into the balls 12, which form connections by embedding the wires 30 into the balls 12. As shown in FIG. 4H, tips of the wires 30 are embedded within the balls 12. The tips are generally circular in shape and are formed by electric flame off (EFO) of the wires 30 by a wire bonding machine.

Referring back to FIG. 1, after the wirebonding process is performed, the die 20, the electrical connections, the wires 30 and a portion of the balls 12 are encapsulated with a second mold compound 24. Again, a known injection molding process is used. The second mold compound is preferably a plastic material, as is known in the art for packaging integrated circuits.

After the encapsulation process, the now packaged die 20 is removed from the mold and the platen 50, thereby uncovering the bottom surfaces of the array of balls 12, as shown in FIG. 1. To ensure reliable interconnection performance, the exposed bottom surfaces 16 of the balls 12 may be coated or plated with a noble surface finish (e.g., NI/Au) that is both resistant to corrosion and provides low contact resistance. The exposed portions of the balls 12 may be coated via selective deposition of electrolytic Ni/Au platings.

Figure 5A:
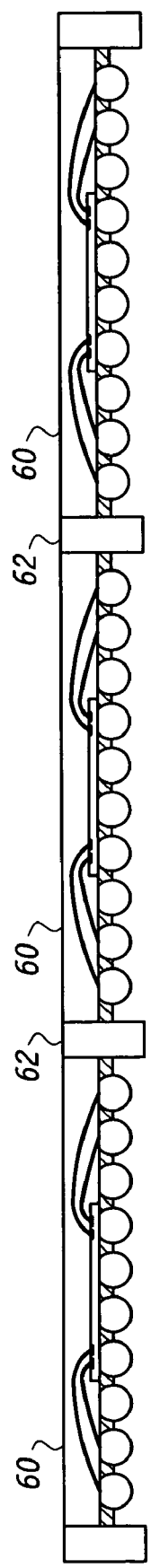
FIGS. 5A and 5B are cross-sectional views illustrating the formation of a plurality of packaged semiconductor devices in accordance with the present invention.
Figure 5B:
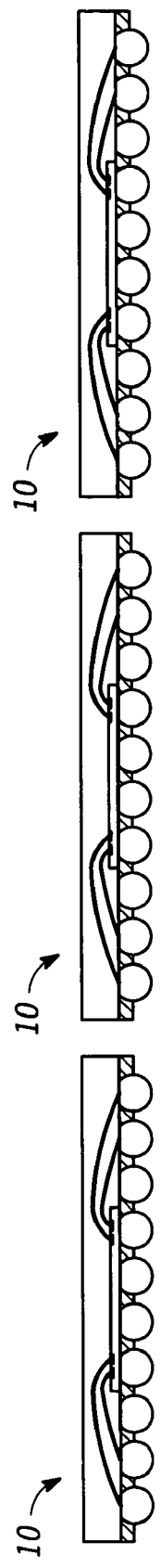

Referring now to FIG. 5A, rather than forming a single package, multiple packages are formed at the same time. FIG. 5A shows three such packages 60. The packages 60 are separated by cutting along saw streets 62, preferably using a well-known saw singulation process, to form separate packaged devices 10, as shown in FIG. 5B. The saw streets 62 are flanges that are formed of the first mold compound 18 during the first mold injection process. The saw streets (flanges) 62 protect the balls 12 embedded in the first mold compound 18 during die attach, wire bonding and the second mold injection processes.

Prior to the saw singulation process, an optional electrical functional test may be performed. Since all of the I/O terminals of the encapsulated devices are separated throughout the packaging process, an electrical test in strip format is possible, hence improving tester utilization and making parallel testing possible without additional process or cost.

The packaged device has improved high-frequency electrical performance because the signal path from the die 20 to the board is shortened. Further, system reliability is improved by increasing solder joint resistance to stress failures caused by deflections of the system board. Improved RF performance and resistance to mechanical stress failures are important issues to cellular telephone handset makers.

The present invention provides an easy and inexpensive method of packaging an integrated circuit. Two layers of mold compound are used, with the C5 balls being embedded into the first layer of mold compound. The top surfaces of the C5 balls act as bond fingers and the bottom surfaces provide stand-off on a PCB. A packaged device can include a heat slug for better thermal performance. Further, the device may be formed using a glob top encapsulation. The device cost is low because neither a substrate nor terminations (external pins) are required. Since there is no metal leadframe, the saw blade used in the singulation step does not have to cut through metal, so the saw blade will have a longer life. Also, since no leadframe is required, there is no need to perform substrate trace routing. The packaging process does not require any chemical etch-back, which can be expensive. The packaging process may be performed using currently available equipment. The package also has a very low profile, down to about 0.4 mm. Although a LGA package is described, other package types, such as QFN (Quad Flat No lead) also can be formed using the aforedescribed method. Stacked die devices can be packaged with this method too. Land grid arrays (LGA) offer high interconnection density, e.g., 200+ I/Os is possible.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method of packaging an integrated circuit die, comprising the steps of:
    loading a plurality of conductive balls into recesses formed in a platen;
    transferring the platen to a cavity of a first part of a mold;
    pressing a second part of the mold against the conductive balls, thereby closing the mold and at least partially flattening a top surface of the conductive balls;
    injecting a first mold compound into the mold, wherein the first mold compound surrounds exposed portions of the conductive balls and holds the conductive balls together;
    removing the second part of the mold to expose the top surface of the conductive balls;
    attaching a first side of an integrated circuit die to a plurality of the conductive balls, wherein the die is surrounded by others of the conductive balls;
    electrically connecting die bonding pads on a second side of the die to respective ones of the conductive balls surrounding the die; and
    encapsulating at least the second side of the die, the electrical connections, and at least part of the top surface of the conductive balls with a second mold compound.

2. The method of packaging an integrated circuit die of claim 1, wherein a mask is used to transfer and place the conductive balls into a bottom cavity of the mold.

3. The method of packaging an integrated circuit die of claim 1, wherein the conductive balls comprise solder balls.

4. The method of packaging an integrated circuit die of claim 1, wherein the platen has an array of recesses for receiving the conductive balls.

5. The method of packaging an integrated circuit die of claim 4, wherein the recesses are spaced at a predetermined pitch.

6. The method of packaging an integrated circuit die of claim 5, wherein the platen includes a space for receiving a heat sink, the method further comprising the step of placing a heat sink within the heat sink receiving area.

7. The method of packaging an integrated circuit die of claim 6, wherein the heat sink has a first side that is generally coplanar with the flattened top surface of the conductive balls and wherein the die attaching step comprises attaching the first side of the die to the first side of the heat sink.

8. The method of packaging an integrated circuit die of claim 1, wherein in the die attaching step, the die is attached to the flattened, top surface of a plurality of the conductive balls.

9. The method of packaging an integrated circuit die of claim 1, wherein the electrically connecting step comprises wirebonding the die bonding pads to the respective ones of the balls with a corresponding plurality of wires.

10. The method of packaging an integrated circuit die of claim 9, wherein in the wirebonding step, the wires penetrate into the balls and are embedded therein.

11. The method of packaging an integrated circuit die of claim 10, wherein the wires are insulated wires.

12. The method of packaging an integrated circuit die of claim 10, wherein the balls are formed of a metal that is softer than the wires so that the wires are embedded in the balls.

13. The method of packaging an integrated circuit die of claim 9, wherein the wires are attached to the top, flattened surface of the balls.

14. The method of packaging an integrated circuit die of claim 1, further comprising the step of saw singulating the encapsulated die from adjacent encapsulated die.

15. The method of packaging an integrated circuit die of claim 1, wherein the conductive balls are embedded into the first mold compound with the flattened surface of the balls being substantially coplanar with a top surface of the first mold compound.

16. The method of packaging an integrated circuit die of claim 15, wherein a surface of the conductive balls opposing the flattened surface of the balls protrudes beyond a bottom surface of the first mold compound.

17. The method of packaging an integrated circuit die of claim 1, wherein the encapsulating step comprises performing a glob top encapsulation process.

18. A packaged integrated circuit die assembled in accordance with claim 1.

19. A method of packaging a plurality of integrated circuit dice, comprising the steps of:
    loading a plurality of conductive balls into recesses formed in a platen;
    transferring the platen to a cavity of a first part of a mold;
    pressing a second part of the mold against the conductive balls, thereby at least partially flattening a top surface of the conductive balls;
    injecting a first mold compound into the mold, wherein the first mold compound surrounds exposed portions of the conductive balls;
    attaching first sides of a plurality of integrated circuit dies on the plurality of the conductive balls at predetermined locations, wherein the dies are surrounded by others of the conductive balls;
    electrically connecting die bonding pads on second sides of the dies to respective ones of the conductive balls surrounding the dies;
    encapsulating at least the second sides of the dies, the electrical connections, and at least part of the conductive balls with a second mold compound; and
    singulating adjacent encapsulated dies to form individual packaged devices.

* * * * *